(12) United States Patent
Ramm (10) Patent No.: US 9,428,826 B2
(45) Date of Patent: Aug. 30, 2016

(54) COATING BASED ON NIAL$_2$O$_4$ IN SPINEL STRUCTURE

(75) Inventor: Juergen Ramm, Maienfeld (CH)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 559 days.

(21) Appl. No.: 13/635,710

(22) PCT Filed: Mar. 18, 2011

(86) PCT No.: PCT/EP2011/054110
§ 371 (c)(1),
(2), (4) Date: Oct. 23, 2012

(87) PCT Pub. No.: WO2011/113927
PCT Pub. Date: Sep. 22, 2011

(65) Prior Publication Data
US 2013/0036942 A1 Feb. 14, 2013

Related U.S. Application Data

(60) Provisional application No. 61/315,106, filed on Mar. 18, 2010.

(30) Foreign Application Priority Data

Aug. 19, 2010 (EP) .................................. 10173410

(51) Int. Cl.
| | |
|---|---|
| *C09D 1/00* | (2006.01) |
| *C23C 14/32* | (2006.01) |
| *C23C 14/08* | (2006.01) |
| *H01J 37/34* | (2006.01) |

(52) U.S. Cl.
CPC ........... *C23C 14/325* (2013.01); *C23C 14/081* (2013.01); *C23C 14/085* (2013.01); *H01J 37/34* (2013.01)

(58) Field of Classification Search
None
See application file for complete search history.

(56) References Cited

U.S. PATENT DOCUMENTS

| | | | |
|---|---|---|---|
| 2,904,449 A | 9/1959 | Bradstreet | |
| 5,683,761 A | 11/1997 | Bruce et al. | |
| 2002/0051852 A1 | 5/2002 | Zywitzki et al. | |
| 2003/0039867 A1* | 2/2003 | Berger et al. | 428/704 |
| 2003/0091868 A1 | 5/2003 | Shimizu | |
| 2004/0042948 A1* | 3/2004 | Kanno et al. | 423/240 S |
| 2006/0048603 A1* | 3/2006 | Sundin et al. | 75/238 |

(Continued)

FOREIGN PATENT DOCUMENTS

| | | |
|---|---|---|
| CN | 101522950 A | 9/2009 |
| CN | 201304457 Y | 9/2009 |

(Continued)

OTHER PUBLICATIONS

International Search Report for PCT/EP2011/054110 dated Jun. 1, 2011.

(Continued)

*Primary Examiner* — Colin W Slifka
(74) *Attorney, Agent, or Firm* — Pearne & Gordon LLP (57) ABSTRACT

The invention relates to a coating that comprises at least one compound of oxygen and/or nitrogen with at least two metal materials, said compound being present at least partly in spinel structure. The invention also relates to a method for coating and to a coated substrate.

20 Claims, 9 Drawing Sheets

(56) References Cited

U.S. PATENT DOCUMENTS

2008/0173536 A1    7/2008   Ramm et al.
2010/0183900 A1*   7/2010   Wallin et al. ................ 428/698

FOREIGN PATENT DOCUMENTS

| | | |
|---|---|---|
| EP | 0 769 576 A1 | 4/1997 |
| WO | 2006/099754 A1 | 9/2006 |
| WO | 2006/099758 A2 | 9/2006 |
| WO | 2006/099759 A2 | 9/2006 |
| WO | 2006/099760 A2 | 9/2006 |
| WO | 2008/009619 A1 | 1/2008 |
| WO | 2008/138789 A2 | 11/2008 |

OTHER PUBLICATIONS

Written Opinion for PCT/EP2011/054110 dated Jun. 1, 2011.
Grasset, et al., "New Nanocrystalline Colored Oxynitride Thin Films From Ti 4+-functionalized ZnO Nanocolloids", Elsevier, Superlattices and Microstructures 38 (2005), pp. 300-307.

* cited by examiner

| Pattern : 01-077-1877 | Radiation = 1.540600 | Quality : Alternate |

NiAl₂O₄

Nickel Aluminum Oxide
Also called: Nickel dialuminum oxide

| 2θ | I | h | k | l |
|---|---|---|---|---|
| 19.063 | 257 | 1 | 1 | 1 |
| 31.418 | 237 | 2 | 2 | 0 |
| 37.012 | 999 | 3 | 1 | 1 |
| 38.722 | 16 | 2 | 2 | 2 |
| 45.015 | 399 | 4 | 0 | 0 |
| 49.316 | 14 | 3 | 3 | 1 |
| 55.916 | 64 | 4 | 2 | 2 |
| 59.640 | 270 | 5 | 1 | 1 |
| 65.553 | 434 | 4 | 4 | 0 |
| 68.958 | 17 | 5 | 3 | 1 |
| 70.606 | 1 | 4 | 4 | 2 |
| 74.436 | 20 | 6 | 2 | 0 |
| 77.746 | 61 | 5 | 3 | 3 |
| 78.842 | 82 | 6 | 2 | 2 |
| 83.054 | 36 | 4 | 4 | 4 |
| 86.226 | 7 | 5 | 5 | 1 |

Lattice : Face-centered cubic
S.G. : Fd-3m (227)
a = 8.049900

Mol. weight = 176.66
Volume [CD] = 521.47
Dx = 4.500
Z = 8
I/Icor = 2.68

Fig. 14

| Pattern : 01-088-4055 | Radiation = 1.540600 | Quality : Deleted |

α-Cr

Chromium
Also called: Chromium - α

| 2θ | I | h | k | l |
|---|---|---|---|---|
| 44.371 | 999 | 1 | 1 | 0 |
| 64.554 | 112 | 2 | 0 | 0 |
| 81.693 | 172 | 2 | 1 | 1 |

Lattice : Body-centered cubic
S.G. : Im-3m (229)
a = 2.88494

Mol. weight = 52.00
Volume [CD] = 24.01
Dx = 7.192
Dm = 7.190
Z = 2
I/Icor = 10.47

Fig. 15

|  |  | EM [N/mm²] | hmax [µm] | EIT/(1-vs^2) [GPa] | nplast [%] | HIT [N/mm²] | HV [ ] |
|---|---|---|---|---|---|---|---|
| Average value | x. : | 14795.68 | 0.1602 | 302.94 | 25.648 | 34893.85 | 3297.47 |
| Confidence interval | q : | 305.05 | 0.0017 | 5.96 | 0.955 | 1090.23 | 103.03 |
| Standard deviation | s : | 887.84 | 0.0046 | 17.35 | 2.781 | 3173.03 | 299.85 |
| Coefficient variation/ % | V : | 6.00 | 3.01 | 5.73 | 10.84 | 9.09 | 9.09 |
| Number of measurement values a : |  | 35 | 35 | 35 | 35 | 35 | 35 |
| Smallest value | : | 13251.1 | 0.151 | 267.0 | 21.42 | 29571.2 | 2794.5 |
| Largest value | : | 16678.3 | 0.169 | 345.3 | 32.17 | 40675.6 | 3843.8 |
| Range | R : | 3427.1 | 0.018 | 78.3 | 10.75 | 11104.3 | 1049.4 |
| Range/ % | R/% : | 23.16 | 11.46 | 25.85 | 41.90 | 31.82 | 31.82 |

Test parameters
F = 10.000mN/20s

Fig. 16

|  |  | EM [N/mm²] | hmax [µm] | EIT/(1-vs^2) [GPa] | nplast [%] | HIT [N/mm²] | HV [ ] |
|---|---|---|---|---|---|---|---|
| Average value | x. : | 14730.84 | 0.1605 | 304.71 | 26.354 | 34236.24 | 3235.51 |
| Confidence interval | q : | 233.52 | 0.0013 | 5.27 | 1.179 | 904.67 | 85.49 |
| Standard deviation | s : | 679.66 | 0.0037 | 15.34 | 3.431 | 2632.97 | 248.82 |
| Coefficient variation/ % | V : | 4.61 | 2.29 | 5.04 | 13.02 | 7.69 | 7.69 |
| Number of measurement values a : |  | 35 | 35 | 35 | 35 | 35 | 35 |
| Smallest value | : | 13580.2 | 0.153 | 283.1 | 20.12 | 29353.3 | 2773.9 |
| Largest value | : | 16135.1 | 0.167 | 361.4 | 39.21 | 40259.9 | 3804.6 |
| Range | R : | 2554.9 | 0.014 | 78.2 | 19.08 | 10906.6 | 1030.7 |
| Range/ % | R/% : | 17.34 | 8.58 | 25.67 | 72.41 | 31.86 | 31.86 |

Test parameters
F = 10.000mN/20s

Fig. 17

|  |  | EM [N/mm²] | hmax [µm] | EIT/(1-vs^2) [GPa] | nplast [%] | HIT [N/mm²] | HV [ ] |
|---|---|---|---|---|---|---|---|
| Average value | x. : | 14089.60 | 0.1646 | 298.46 | 29.898 | 31467.55 | 2973.68 |
| Confidence interval | q : | 620.15 | 0.0036 | 11.50 | 2.519 | 2158.46 | 203.97 |
| Standard deviation | s : | 1433.75 | 0.0084 | 26.59 | 5.824 | 4990.25 | 471.58 |
| Coefficient variation/ % | V : | 10.18 | 5.11 | 8.91 | 19.48 | 15.86 | 15.86 |
| Number of measurement values a : |  | 23 | 23 | 23 | 23 | 23 | 23 |
| Smallest value | : | 11569.9 | 0.151 | 251.5 | 19.15 | 23658.3 | 2235.7 |
| Largest value | : | 16674.7 | 0.181 | 350.0 | 39.87 | 41351.2 | 3907.7 |
| Range | R : | 5105.7 | 0.030 | 98.5 | 20.72 | 17692.8 | 1672.0 |
| Range/ % | R/% : | 36.24 | 18.34 | 32.99 | 69.31 | 56.23 | 56.23 |

Test parameters
F = 10.000mN/20s

Fig. 18

|  |  | EM [N/mm²] | hmax [µm] | EIT/(1-vs^2) [GPa] | nplast [%] | HIT [N/mm²] | HV [ ] |
|---|---|---|---|---|---|---|---|
| Average value | x. : | 14352.17 | 0.1626 | 307.66 | 30.357 | 31622.01 | 2988.28 |
| Confidence interval | q : | 322.14 | 0.0018 | 6.26 | 1.415 | 1227.16 | 115.97 |
| Standard deviation | s : | 797.38 | 0.0045 | 15.50 | 3.503 | 3037.46 | 287.04 |
| Coefficient variation/% | V : | 5.56 | 2.75 | 5.04 | 11.56 | 9.61 | 9.61 |
| Number of measurement values | n : | 26 | 26 | 26 | 26 | 26 | 26 |
| Smallest value | : | 12994.7 | 0.155 | 278.0 | 23.22 | 26573.9 | 2511.2 |
| Largest value | : | 15817.3 | 0.171 | 344.9 | 36.78 | 37752.5 | 3567.6 |
| Range | R : | 2822.6 | 0.016 | 66.9 | 13.56 | 11178.6 | 1056.4 |
| Range/% | R/%: | 19.67 | 9.84 | 21.73 | 44.74 | 35.35 | 35.35 |

Test parameters
$F = 10.000mN/20s$

Fig. 19

| Bonding layer | Support layer | Target(s) of the functional layer [at%] | Oxygen flow at the functional layer [sccm] | Functional layer |
|---|---|---|---|---|
| without | Ni-Al-N | Ni/Al (30/70) | 300 | NiAl$_2$O$_4$ (Al$_2$O$_3$) |
| TiN | Ni-Al-N | Ni/Al (30/70) | 800 | NiAl$_2$O$_4$ (Al$_2$O$_3$) |
| TiAlN | TiAlN | Ni/Al (20/80) | 400 | NiAl$_2$O$_4$ (Al$_2$O$_3$) |
| AlTiN | AlTiN | Ni/Al (30/70) | 1200 | NiAl$_2$O$_4$ (Al$_2$O$_3$) |
| Ni-Al | Ni-Al-N | Ni/Al (30/70) | 200 | NiAl$_2$O$_4$ (Al$_2$O$_3$) |
| Ni-Cr | Ni-Cr-N | Ni/Al 60/40) |  | NiAl$_2$O$_4$ (NiO) |
| Cr |  | Ni/Al (30/70) Ni/Al (20/80) |  |  |

US 9,428,826 B2

COATING BASED ON NIAL$_2$O$_4$ IN SPINEL STRUCTURE

FIELD OF THE INVENTION

The invention relates to a coating according to the preamble of claim 1.

Description of Related Art

CVD (Chemical Vapor Deposition) oxide layers resp. layer systems that contain these CVD oxide layers, widely used in the field of chip-cutting/machining of steel and cast iron, are known. In this respect, the oxide layer consists predominantly of aluminum oxide in corundum structure (alpha-aluminum-oxide or α-Al$_2$O$_3$), which is deposited at temperatures around 1,000° C. onto the tools. The high deposition temperature (=substrate or tool temperature) essentially limits the choice of materials for the tools to carbides such as tungsten carbide, or to composite materials of ceramic materials in a metallic matrix (so-called cermets), or to ceramics that are stable at high temperatures such as SiC or SiN. In many applications, especially in the case of carbide cutting inserts, the α-Al$_2$O$_3$ is however not deposited directly onto the tool but a TiCN layer is fist applied which is harder but less resistant to oxidation than the α-Al$_2$O$_3$. This layer system thus constructed is particularly advantageous when it is possible to work with thick (>15 µm) layer systems, which is the case especially in continuous chipping of gray cast iron. In case of intermittent cutting, the tensile stresses in the layer that occur due to the high deposition temperature and the temperature-related mismatch between layer materials and substrate are unfavorable. This results in the formation of cracks in the layer system, sometimes even before the tool is used.

However, the advantage of the CVD process of producing thick layers in a relatively simple and cost-effective manner has no effect when processing particularly tough materials. In this case, very sharp tool edges must be provided and the coating may not result in a strong enlargement of the tool edge radius, as is the case for thick CVD layers and uniform layer deposition.

A further disadvantage lies in the fact that material smearings can occur on the tool's edge, fostering uncontrolled edge deterioration. These smearings are presumably related to the reactive capability of Ti in the layer. It has indeed been observed that Ti—Al—N layers break down at temperatures between 800° C. and 900° C. on the surface and porous surface layers with low mechanical strength are generated. The chemical or oxidative layer resistance of this material system is thus no longer ensured at these temperatures. Experience has shown that such smearings can be drastically reduced if an oxide layer seals the nitride layer towards the layer surface. To try and solve this with a CVD layer system is unsatisfactory for the following reasons: first, for the reasons already mentioned above, no thick layers may be deposited, otherwise the sharp cutting edge geometry cannot be maintained. Second, the CVD layers usually consist of TiCN and α-Al$_2$O$_3$ and both materials are inferior both in hardness and toughness to a good Al—Ti—N layer. For a similar layer thickness, this would probably result in shorter lifetimes. And finally, the CVD layer system is subjected to tensile stresses, which at least in the case of applications with intermittent cutting would lead to earlier layer failure.

In the fields of application of materials that are difficult to machine, such as for example titanium and its alloys (for example with magnesium) as well as alloys on the basis of nickel (partly known under the commercial name Inconel®), tools (e.g. cutting inserts) with a small cutting edge radius, i.e. with sharp edge geometry, are known in the current state of the art. In order not to lose the edge sharpness also after the coating, thin layers are therefore necessary that are advantageously produced by means of PVD (physical vapor deposition). The directionality of the PVD coating is of course advantageous in this case as it enables the cutting and clearance surfaces of a cutting insert to be coated at different rates with corresponding substrate holders. Layers of Al—Ti—N are preferably used for these applications, with different metal contents. This Al—Ti—N material produced by means of PVD has, in addition to high toughness, also good oxidation resistance properties. Tools that are coated with these wear-reducing layers, are nowadays considered the best solution for tool coatings in the application field of materials that are difficult to machine.

The machining parameters for such applications are however clearly different from those that are used for mild steel and cast iron. Typical cutting speeds for the nickel-based alloys are 50 m/min and less, compared to several hundred meters per minute in steel or cast iron. The reason for this is the enormous mechanical and thermal stress on the cutting edge that arise in applications for materials that are difficult to machine. Therefore, work has been undertaken to improve the tool materials, especially in terms of the improvement of the heat conductivity. An improvement of the tool coating with respect to heat stability (oxidation resistance, chemical stability and mechanical strength at high temperatures) would additionally contribute to alleviate the problems outlined.

One disadvantage of the current state of the art is thus the low productivity when machining materials that are difficult to machine, caused by the low machining speed.

One interesting kind of PVD coating is the sputtering of targets. During this process, ions are accelerated onto the target surface and knock out small conglomerates out of the target. This possibility has been described for example in WO2008/148673. This document presents a diffusion process (HIPIMS, high-power impulse magnetron sputtering) in which sputtering occurs from one or several AlMe alloy targets, wherein according to one embodiment the deposited layer includes two oxide phases or a mixed oxide of the type (Al$_{1-x}$Me$_x$)$_2$O$_3$ or the spinel (Me)$_x$Al$_2$O$_{3+x}$ (0>x≤1). Unfortunately, this publication does not indicate how and through what measures it is possible to chose between the two oxide phases and the mixed oxide or how the coating process needs to be performed in order to choose specifically between the layer type (Al$_{1-x}$Me$_x$)$_2$O$_3$ or the spinel (Me)$_x$Al$_2$O$_{3+x}$. The example confirms the possibility of producing an oxide of the type (Al$_{1-x}$Me$_x$)$_2$O$_3$, namely alpha-Al$_2$O$_3$, but the question remains open as to how other structures are to be achieved. In particular, the one skilled in the art will therefore enquire which measures need to be taken in order for the conglomerates of any structure eroded out of the target during the sputtering process to be deposited in a targeted fashion as spinel (Me)$_x$Al$_2$O$_{3+x}$ onto the substrates to be coated.

BRIEF SUMMARY OF THE INVENTION

One aim of the invention is to propose a layer that essentially combines the high degree of hardness and toughness of the Ti—Al—N (or Al—Ti—N) with greater thermal stability towards chemical reactions resp. oxidation. Furthermore, a layer material is to be created that has outstanding mechanical properties, also at increased temperatures.

The aim is achieved with the characteristics of claim 1.

Advantageous further embodiments are indicated in the dependent claims.

The coating, the layer or the layer system according to the invention is deposited onto cutting tools in order to reduce the abrasive, chemical and oxidative wear and tear of these cutting tools during the machining process.

This oxide-containing layer or the layer system is preferably used for tools that are used for the machining of materials that are reputedly "difficult to machine", such as for example titanium alloys, steel alloys with a high nickel content and some kids of stainless steels with special alloys that increase the hardness and the chemical protection of the materials.

The layer or the layer system can also find application for catalytic purposes.

The solid materials, which constitute the layer, advantageously have both as oxide and as nitride a similar crystal structure and preferably crystalize in a cubic structure, with the oxide preferably at least partly in the cubic structure of the spinel.

One aim of this invention is that the layer be arranged in such a manner that in addition to the oxides in spinel structure, a proportion of other oxides can also be included that can form from the solid material components of the used arc target. These oxides should have inasmuch as possible a microcrystalline or amorphous structure and thus serve to improve the mechanical layer properties, in particular at increased temperatures. For example, they should achieve an increase in the break resistance of the layer and reduce mechanical tensions that could arise due to the different expansion coefficients between the functional oxide layer and the support and bonding layers as well as the substrate (tool).

According to the invention, multilayer coatings can be produced that are essentially synthesized in a crystal structure.

In addition to tools of high temperature resistant materials such as carbides (cemented carbide), composite materials (cermets), diamond, ceramics of SiC (silicon carbide), SiN (silicon nitride), c-BN (cubic boron nitride), it should advantageously be possible with the inventive layer or layer system to also coat materials that are less temperature resistant made of HSS (high speed steel) or other steel alloys such as components made of aluminum.

According to the invention, the aim is achieved by layers that comprise at least one $NiAl_2O_4$ layer in spinel structure. According to a preferred embodiment, an inventive layer contains $NiAl_2O_4$ in spinel structure as well as aluminum oxide in at least one of the phases from the group x-ray amorphous, corundum structure, gamma phase, kappa phase or theta phase. According to another preferred embodiment, the inventive layer contains $NiAl_2O_4$ in spinel structure as well as a NiO component that is preferably in x-ray amorphous phase.

Figure 11:
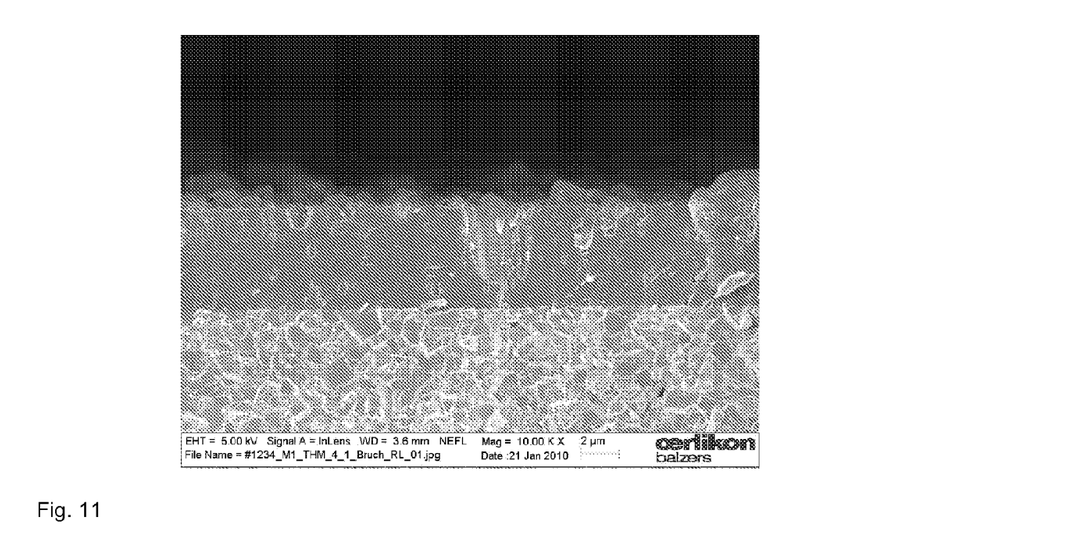
FIG. 11: an SEM cross-sectional view of a layer system from an Al—Ti—N protection layer and an inventive Ni—Al—O functional layer.

In another particularly advantageous embodiment of the present invention, XRD (x-ray diffraction) measurements on the layer will yield at least 2 reflexes, preferably even 3 reflexes, which essentially correspond to the reference 01-077-1877 of $NiAl_2O_4$ indicated in FIG. 11 and essentially do not derive from the substrate. These are preferably the reflexes of the [3 1 1] plane at $2\theta=37.0°$, of the [4 0 0] plane at $2\theta=45.0°$ and of the [5 1 1] plane at $2\theta=59.6°$. In the eminently preferred embodiment of the present invention, the x-ray spectrum in the angular range $20°\leq2\theta\leq90°$ shows in addition to the reflexes of the substrate essentially only reflexes of the $NiAl_2O_4$, reference 01-077-1877 of FIG. 11.

In a further preferred embodiment, there is a multilayer system containing layers with $NiAl_2O_4$ in spinel structure and additionally metallic oxides and/or nitrides, wherein in neighboring layers the metallic proportions differ in percentage. Due to the multilayer design, the toughness is increased. As a result, there is essentially no thickness limitation anymore. Furthermore, the energy inherent to the layer system can be increased, which leads to greater degrees of hardness. According to the invention, the multilayer system containing the $NiAl_2O_4$ in spinel structure can also contain alternately one or several additional crystalline and amorphous oxide phases, preferably high temperature phases.

In a further embodiment of the present invention, gradient layers are achieved that comprise $NiAl_2O_4$ in spinel structure with uniform lattice constants and the proportion of an amorphous phase present within the layer varies stepwise and/or continuously.

The inventors have surprisingly established that the inventive layers can be produced in an economically viable manner by means of arc evaporation. During arc evaporation, so-called droplets are generated. These are conglomerates of incompletely oxidized or incompletely nitrified metallic components or intermetallic compounds that originate from the target. The production of inventive layers is then particularly economical when it is possible to forgo the filtration of such droplets. A layer that has such droplets can thus be identified as a layer produced by means of arc evaporation. According to one embodiment of the present invention, the layers containing $NiAl_2O_4$ in spinel structure thus have the droplets typical of arc evaporation. It in particular possible to generate layers produced by means of arc evaporation that comprise $NiAl_2O_4$ in spinel structure or in a cubic structure, whose droplets have predominantly, preferably essentially all, a metallic proportion of less than 50 at % nickel.

BRIEF DESCRIPTION OF THE DRAWINGS

The invention will be explained by way of example on the basis of a drawing, which shows.

DETAILED DESCRIPTION OF THE INVENTION

The invention is based on experiments that were performed in a arc evaporation facility of the type Innova of the company OC Oerlikon Balzers AG. Cutting inserts of carbide (based on WC) and composite materials (cermets) were used as substrates for the coating. The arc sources were provided with Ni—Al targets. In the described case, powder-metallurgical produced targets were used. But targets produced in other ways, containing the combination of Ni and Al in the target, can also be used for this process, for example cast-bonded metallurgical or plasma-arc spray produced targets. Additionally, work was done with targets of other materials in order to produce the relevant bonding layer or support layer or in order to integrate their solid materials in the transition to the functional layer or into the functional layer itself.

The principal method of arc evaporation for the production of oxides is known. In the present case, the fundamental principles of arc evaporation will thus be addressed only roughly.

As a rule, during arc evaporation, plasma is generated in a vacuum chamber in the form of a high-current low-voltage arc discharge onto a material source, hereinafter called target. The material to be evaporated is arranged in this process as cathode at the negative ole of a voltage source. The electric arc is ignited for example by means of an ignition device. The electric arc melts the cathode at one or several cathode spots in which the current transfer is concentrated. In doing so, it is essentially the electrons from the cathode that are extracted. In order to maintain the electric arc, it is thus necessary to continuously provide a supply of electrons on the corresponding cathode surface. The electric arc, also synonymously called arc, moves on the cathode surface. This results in an extremely fast heating up of small target surface areas, whereby material is evaporated locally.

For an in-depth description, reference should be made to the patent applications filed in the name of the same applicant, such as for example WO 2006/099760, WO 2006/099759, WO 2008/009619, WO 2006/099758 or WO 2008/043606.

For the production of the inventive oxide layer (functional layer), combined Ni—Al targets were used that had nickel ratios of between 10 at % and 80 at %, preferably between 20 at % and 60 at %.

As reactive gas for the functional layer, either pure oxygen or a mixture of oxygen and nitrogen were used during the arc evaporation, both with as well as also without adjunction of argon. In the transitions between the bonding or support layer and the functional layer, nitrogen or a mixture of nitrogen and oxygen, again with optional adjunction of argon, was used. The choice and adjunction of the gases is determined by which chemical composition is sought for the layer to be synthesized: pure nitrogen for a nitride, pure oxygen for an oxide or a mixture of both gases for an oxy-nitride. The one skilled in the art in the field of PVD coating knows that other reactive gases an be added to the arc evaporation, for example C$_2$H$_2$ as an example of a carbon-containing gas in order to produce carbides, or a mixture of C$_2$H$_2$ and nitrogen in order to produce carbonitrides. These possibilities are used in particular for the bonding and/or support layer. The gas flows for the above mentioned coating system are regulated through gas flow controllers. There is additionally also the possibility of regulating the gases by means of the chamber total pressure (pressure control), which can also be used in some cases of layer production. Typical chamber total pressures were between 0.3 Pa and 10 Pa, typical gas flows between 0 and 2000 sccm.

The arc currents were varied within a wide range. For the deposition of the functional layer, work was done with currents between 60 A and 350 A, with both DC as well as pulsed arc currents being used. The range of the preferred arc currents was between 80 A and 200 A.

Substrates were coated in a substrate temperature range between 200° C. to 600° C. that were biased with a substrate bias between −20 and −300 V. Preferably, bipolar pulsed substrate bias was used, especially during the coating with the oxide layers.

Prior to the actual coating step, the preliminary heating and etching processing steps known to the one skilled in the art were performed in vacuum, in order to subject the substrates already cleaned outside the vacuum to yet a further pretreatment in vacuum.

After these preliminary treatment steps, the substrates are coated with the layers that take place even before the actual deposition of the functional layer. Usually, this is a layer that serves as an intermediate or bonding layer (interface) for the later layer or the later layer strata. Typical known materials for this bonding layer are Al, Ti, Cr, Zr, Nb both in metallic form as well as also as nitrides. In order to improve the adhesion in some cases for certain tools (substrates), these layers according to one embodiment of the present invention can contain Ni and/or Co. Combinations of these materials and of their nitrides also lead in many cases to improved layer adhesion. By way of example, Ni—Cr, Ni—Al—Cr, Zr and their nitrides can be mentioned, without this enumeration being understood as limiting in any way.

After the intermediate or bonding layer, it can make sense depending on the application to apply other layers before depositing the actual functional layer. These can for example serve to create an adapted transition to the functional layer. They can however also increase the wear-resistance of the entire layer strata, i.e. they themselves have a functional relevance. The one skilled in the art knows nitrides and carbonitrides of the elements Al, Ti, Cr, Zr and Nb as well as nitrides and carbonitrides of respectively two such elements (e.g. AlTiN or AlCrN). It has proved particularly advantageous for these layers to also contain Ni and/or Co.

For the coating of the bonding layer and/or of the support layer, either elemental metallic targets that consist of the above mentioned metals are used, or combined targets produced from combinations of two or several elements are used, for example powder-metallurgical, or as alloy, or as intermetallic compound or through plasma-arc spray.

Finally, the substrate coated with the bonding layer and the support layer is then coated with the actual functional layer. The transition from the bonding or support layer to the functional layer can be designed seamlessly or abruptly. Seamless transitions can be achieved for example by operating the targets that were required for the bonding layer or the support layer for a while longer together with the targets of the functional layer so that a mixed layer is obtained in the transition. Another possibility to achieve a mixture resp. a graded transition consists in ramping the gas flows. In the event that a nitride layer was deposited for the bonding or support layer, the targets of the functional layer can initially be operated with nitrogen that is then replaced gradually or abruptly for example with oxygen, in order to pass from a nitride into an oxy-nitride and then into the pure oxide.

As first preferred embodiment of the functional layer, a Ni—Al-oxide layer is deposited. For the coating, Ni—Al mixed targets with a mixture of 30 at % nickel and 70 at % Al are used and the evaporation of the target material takes place in pure oxygen atmosphere. In this respect, the oxygen flows are selected from the range indicated further above. The targets can again have been powder-metallurgical produced, or as alloy, or as intermetallic compound or through plasma-arc spray. In the present experiment, powder-metallurgical targets were used. It should be recalled here that nickel has magnetic properties. This can lead to an undesirable steering of the arc on the target. This has not been shown yet in practice because the adjunction of oxygen or nitrogen has a stabilizing effect on the arc discharge. In particularly critical cases, a pulsed arc operation can further promote this stabilizing.

As a result of this synthesis, an oxide layer is surprisingly achieved whose x-ray spectrum indicates a cubic structure and which, by comparison with the data base can be allocated without doubt to the compound $NiAl_2O_4$. This result is surprising especially also because no Bragg reflexes of other oxides are found, neither reflexes of any kind of aluminum oxides nor of nickel oxides. Yet the one skilled in the art knows that the $\alpha$-$Al_2O_3$ is formed at about 1000° C. whilst on the other hand the $NiAl_2O_4$ forms at useful rates only at higher temperatures above 1300° C. One would thus expect that the corundum phase of the $Al_2O_3$ would rather be formed than the spinel phase of the $NiAl_2O_4$.

Figure 1:
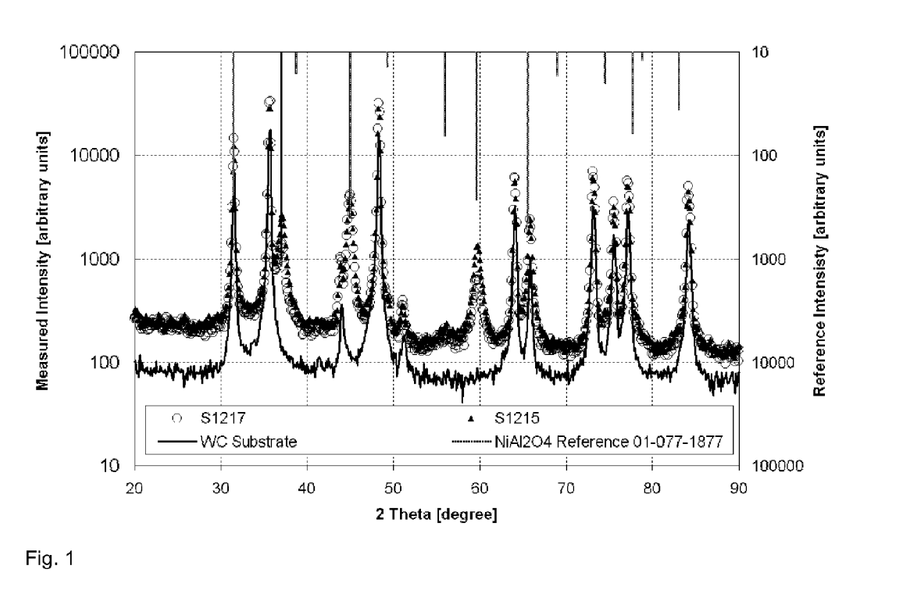
FIG. 1: a comparison of the XRD spectra of samples 1215 and 1217, which have been produced with different oxygen flow but show nearly identical reflexes.
Figure 13:
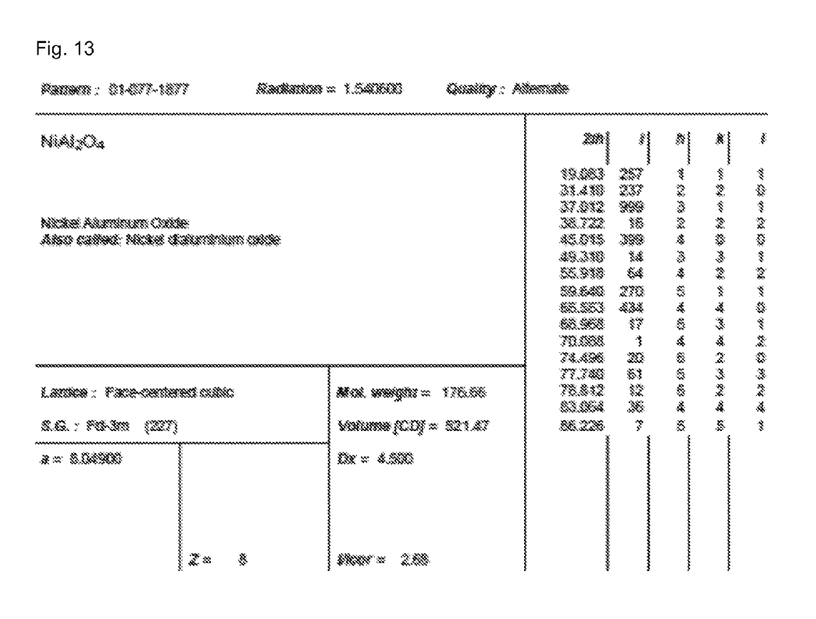
FIG. 13: reference data for NiAl$_2$O$_4$ (reference 01-077-1877)

A series of these Ni—Al oxide layers was produced and analysis thereof was performed. In FIG. 1, the XRD spectra of Ni—Al oxide layers are shown that were produced with different oxygen flows. A logarithmic representation was chosen for the intensity of the scattered ex-rays in order to better differentiate between the substrate and the coated substrates. The XRD spectrum of the uncoated WC substrate (cutting insert) can be seen as a line with pronounced noise. By comparison thereto, the XRD spectra of the coated substrates are represented by means of circular and triangular symbols. The measuring points of sample 1215 were represented with open triangle symbols and the measurement values of sample 1217 with open circle symbols. An $NiAl_2O_4$ spectrum (01-077-1877, FIG. 13) from the XRD database was additionally entered into the illustration in the form of bars from above (black lines) by way of comparison, with the bar lengths reflecting the relative intensities of the x-ray reflexes of the reference sample to one another. All reflexes of the x-ray spectrum of both coated substrates can be allocated. The reflexes dominant in the measured spectrum (311), (400) and (511) can be assigned without any problem to the reference data. In addition to these dominant reflexes, there are also the reflexes (331) and (422) as well as suggestions of (531) and (442) with lower intensity. The reflexes (220), (440) and (444) overlap with the substrate reflexes. The XRD analysis clearly illustrates that it is possible to synthetize by means of reactive arc evaporation a crystalline layer of $NiAl_2O_4$ that has a cubic (Fd-3m) or spinel structure. This synthesis took place in the present example at a substrate temperature of 550° C. This substrate temperature is clearly under the temperature for the formation of this compound in thermal equilibrium.

Figure 2:
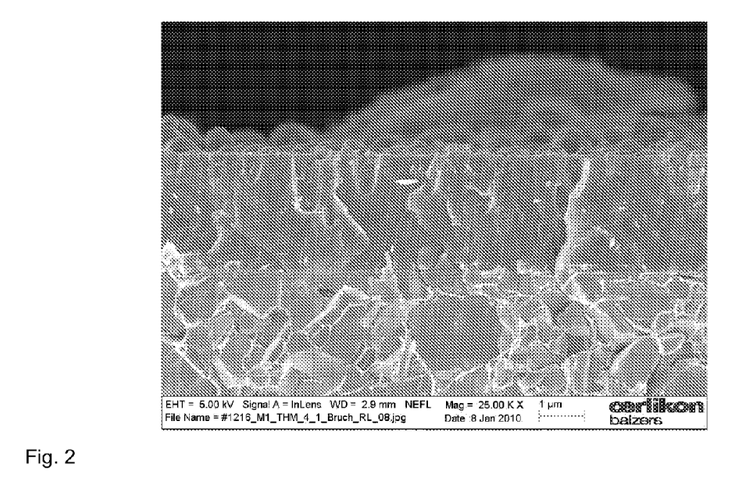
FIG. 2: an SEM cross-section of sample 1216 showing the $NiAl_2O_4$ layer with the approx. 150 nm thick chromium bonding layer.
Figure 3:
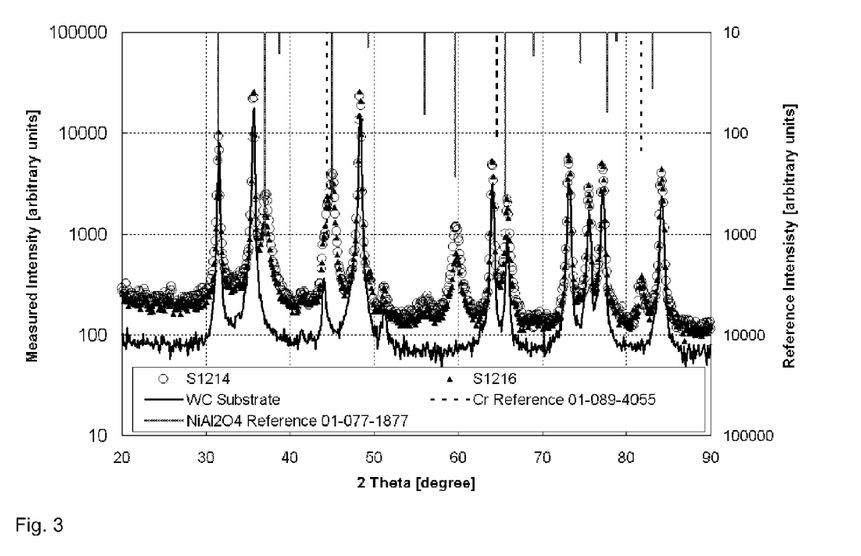
FIG. 3: a comparison of the XRD spectra of samples 1214 and 1216, which have been produced with different oxygen flow and chromium bonding layer and again show nearly identical reflexes, there is no indication that the chromium bonding layer influences the spinel structure of the $NiAl_2O_4$.
Figure 4:
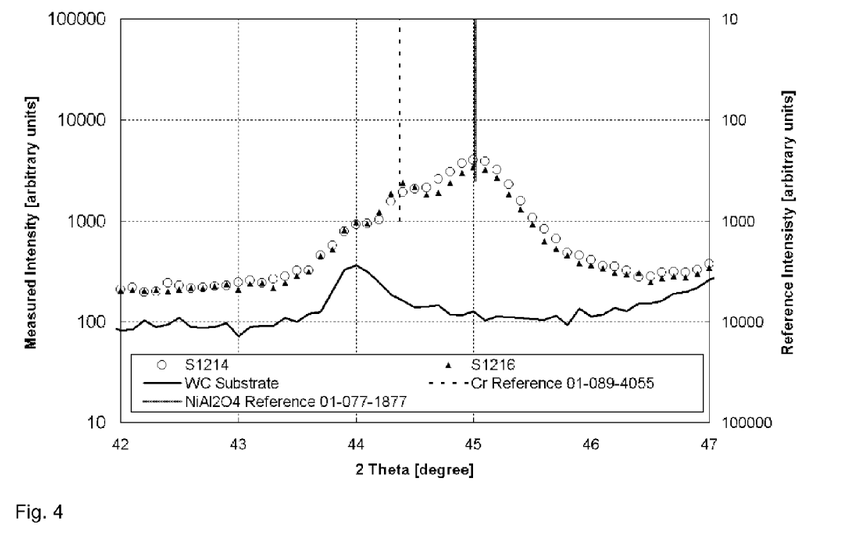
FIG. 4: a comparison of the XRD spectra of samples 1214 and 1216, which have been produced with different oxygen flow and chromium bonding layer and again show nearly identical reflexes, wherein the 2θ scale represented in a better resolution shows that the Cr peak of the bonding layer lies neither on the WC reflex of the substrate nor on that of the $NiAl_2O_4$.
Figure 14:
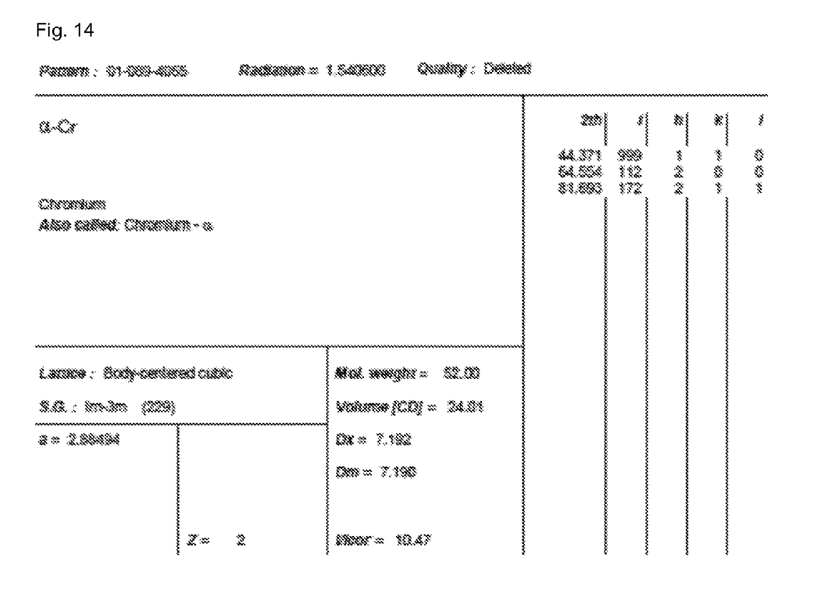
FIG. 14: reference date for Cr (reference 01-089-4055)
Figure 15:
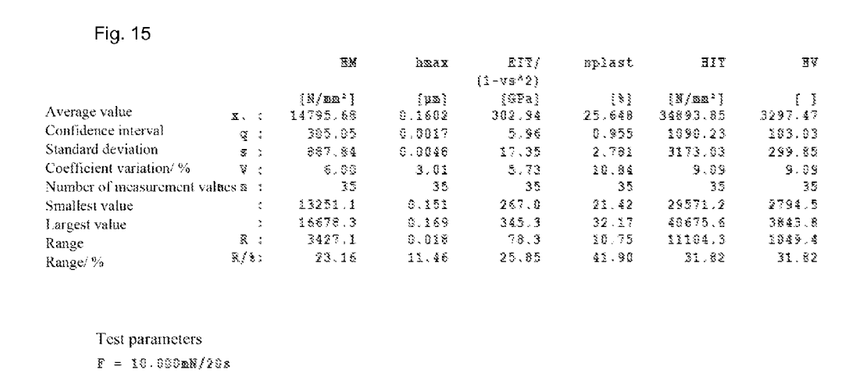
FIG. 15: material constants of sample 1214.
Figure 16:
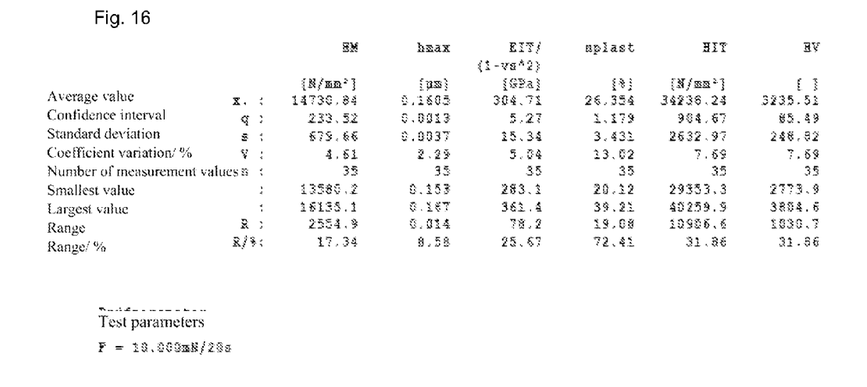
FIG. 16: material constants of sample 1215.
Figure 17:
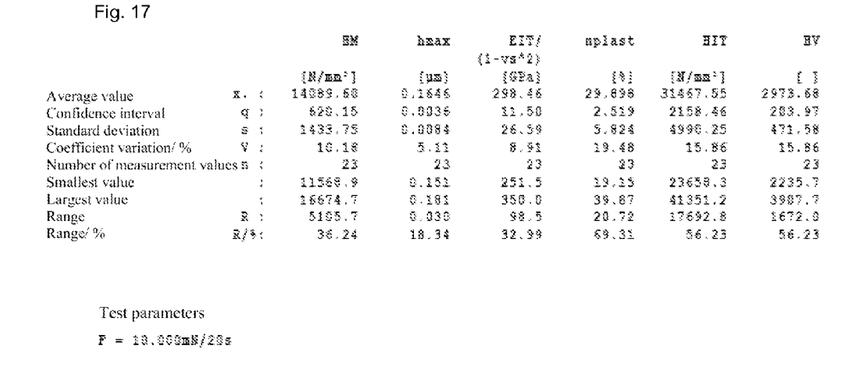
FIG. 17: material constants of sample 1216.
Figure 18:
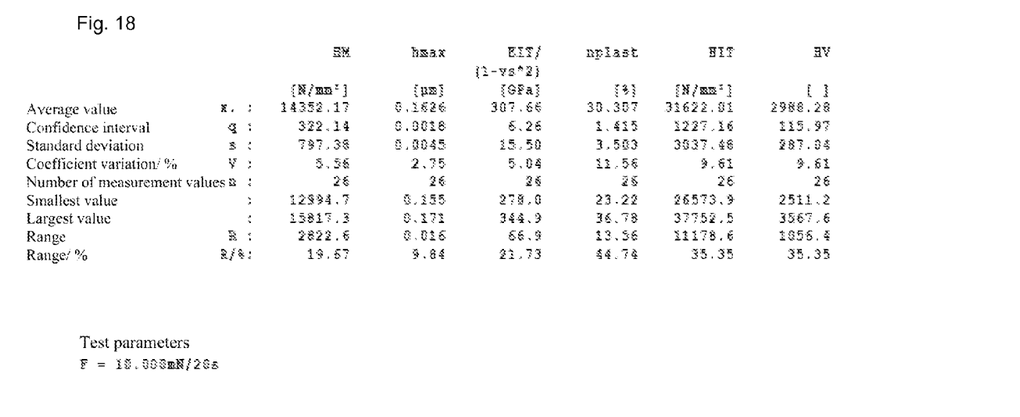

The layers shown in FIG. 1 were synthetized with different reactive gas flows but deposited directly onto the WC substrate without bonding layer. As previously discussed, FIG. 1 shows the overlap of some substrate reflexes with the layer reflexes. In order to exclude to a large extent that the layer could be synthesized in a spinel structure only because this "nucleating aid" of the substrate was achieved, both coatings were produced in otherwise identical processes but with an additional chromium bonding-layer of approx. 150 nm thickness. Sample 1214 was produced with 300 sccm and sample 1216 with 800 sccm oxygen flow. In FIG. 2, the SEM image of a rupture cross-section on sample 1216 is shown and it is possible to recognize the thin bonding layer. The result of the XRD analysis on these layers is represented in FIG. 3. For the chromium, a reference spectrum (01-089-4055, FIG. 14), with a Im-3m (body-centered cubic) structure, was again selected from the XRD database. This spectrum explains as expected the additional peaks in the spectrum that originate from the chromium bonding-layer. The chromium peaks of the reference are represented as grey bars. For the low Ni—Al—O layer thickness of approx. 2 μm, the Cr can still be measured adequately. The (211) peak of Cr shows no overlap with substrate peaks. The (110) peak can easily be separated with a 2θ scale in a higher resolution, as has been done in FIG. 4. With this improved resolution, a clear separation of the substrate peak from the (110) Cr peak and from the (400) $NiAl_2O_4$ peak can be seen. The (200) Cr peak however shows again overlaps with the substrate peak. Because for all samples 1214 to 1217 the measured layer peaks of $NiAl_2O_4$ can be found at practically the same 2θ values, as shown by the comparison of FIGS. 1 and 3, it is possible to conclude that there results a formation of $NiAl_2O_4$, regardless whether working with or without bonding layer before layer deposition of the Ni—Al—O functional layer, i.e. no nucleating layer is needed.

The chemical composition of the layers that were produced with 300 sccm and with 800 sccm oxygen flows, was also analyzed. The analysis was performed by means of EDX (Energy-dispersive X-ray spectroscopy) and RBS (Rutherford backscattering spectrometry) measurements. Since for the metallic compositions no essential difference between the EDX and the RBS analysis could be found, only the RBS measurements will be discussed here, as they give a qualitatively better indication on the oxygen content as well as a quality description of the depth profile of the metals in the vicinity of the layer surface.

Figure 5:
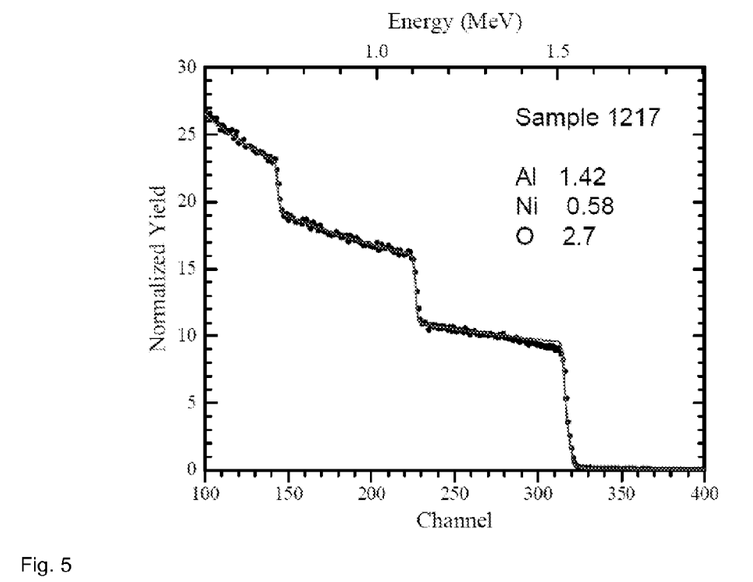
FIG. 5: a RBS (Rutherford backscattering spectrometry) spectrum of sample 1217 with computed layer composition.
Figure 6:
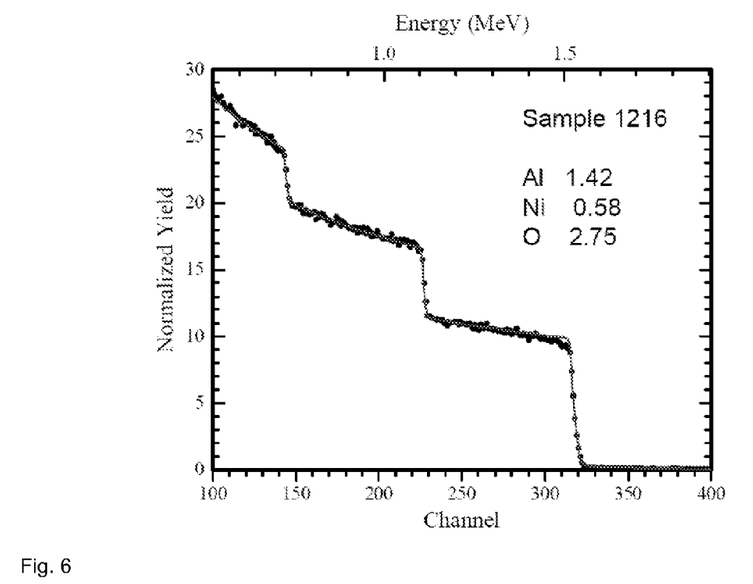
FIG. 6: a RBS spectrum of sample 1216 with computed layer composition.

FIG. 5 shows the RBS spectrum of sample 1217. The evaluation yielded a composition of $Ni_{0.58}Al_{1.42}O_{2.7}$. When normalized to the nickel, this results in $Ni_1Al_{2.45}O_{4.66}$. At first sight, this would appear to yield a discrepancy to the XRD analysis, since there the peaks of the spinel structure can be unambiguously be allocated to the stoichiometric $NiAl_2O_4$. This fact can be explained in that in addition to the $NiAl_2O_4$, another oxide material is formed. On the basis of the target composition, aluminum oxide would of course suggest itself. If one thus assumes that stoichiometric spinel is formed and constitutes the difference thereto, one obtains $Al_{0.45}O_{0.66}$ or, normalized differently, $Al_2O_{2.94}$, which corresponds within the error margins to the stoichiometric aluminum oxide. According to expectations, the sample 1216 (FIG. 6) achieves the same composition, since, with the exception of the Cr bonding layer, it is also itself produced in an identical deposition process for the oxide functional layer.

Figure 7:
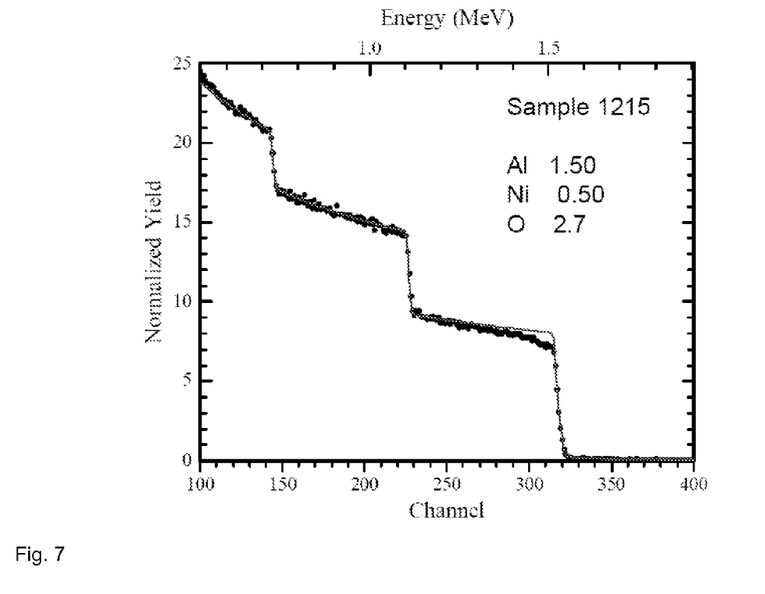
FIG. 7: a RBS spectrum of sample 1215 with computed layer composition.
Figure 8:
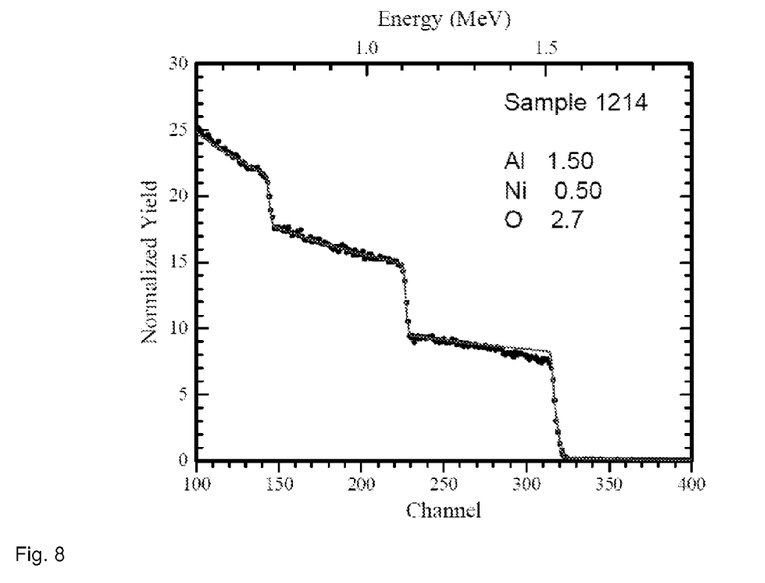
FIG. 8: a RBS spectrum of sample 1214 with computed layer composition.

Another result is however achieved for sample 1215 (FIG. 7) and 1214 (FIG. 8), which were produced at a lower oxygen flow. For both samples, a composition of $Ni_{0.5}Al_{1.5}O_{2.7}$ is obtained, which when normalized to Ni corresponds to a composition of $NiAl_3O_{5.4}$. This implies a layer consisting of $NiAl_2O_4$ with additional portions of $AlO_{1.4}$ or, which is the same, $Al_2O_{2.8}$, i.e. again an additional content of aluminum oxide in the layer.

The measurement results support the following conclusions: Once, in addition to the $NiAl_2O_4$ spinel, the material additionally present in the target is converted into an oxide. The spinel is however determinant for the crystal structure and the aluminum oxide is present as x-ray amorphous, i.e. the crystallite size is too small to lead to reflexes in the x-ray diffraction. Although no electron diffraction was performed onto these layers, it is expected that such an analysis would reveal micro-crystalline $Al_2O_3$ with crystallite sizes around 5 nm or smaller in a high temperature phase (alpha, theta, gamma, kappa).

The second surprising conclusion relates to the connection of the ratio of the metallic contents in the synthetized layer. Whilst for the layers with 300 sccm oxygen flow (samples 1214 and 1215) an Al/Ni ratio of 3.0 was measured (and this in the area close to the surface), for 800 sccm oxygen flow (samples 1216 and 1217) will yield an Al/Ni ratio of 2.5. This means that it is possible by means of the oxygen flow to regulate the concentration of the target components Ni and Al in the layer (with the same target concentrations of the metallic components!). The possibility that the target surface after several hours of arc operation was still not in "equilibrium" (i.e. that the surface of the powder-metallurgical produced targets still had not been conditioned), can be excluded from experience of other coating processes with reactive arc evaporation. The target surfaces recorded in the SEM with the elastically backscattered electrons shows this too.

Judging by the experiments, the oxygen is used in particular for the $NiAl_2O_4$ spinel structure and from the "remainder" of the available oxygen aluminum oxide is formed. By increasing the oxygen flow further to 1200 sccm, this practically lead to a stoichiometric layer formation corresponding to the target, which in the present case was $NiAl_2O_4$. It was not possible to explain exactly why this influencing of the ratio of the target components through the oxygen flow relative to the layer is achieved.

For targets with greater nickel contents (for example above 50 at %) it was proven that in addition to the formation of the $NiAl_2O_4$ spinel, nickel oxide and not aluminum oxide was formed. In this case too, the influencing of the Al/Ni ration through the oxygen flow was again observed.

This is considered inventive, since it enables, with the same target composition, layers to be produced with different ratio of the metal components present in the target, in particular such mixed oxide layers, by regulating the oxygen flow.

The results discussed so far clearly indicate how important it is that when synthesizing $NiAl_2O_4$ layers, wide areas can be coated in oxygen flow. The reactive arc evaporation process thus offers enormous advantages by comparison with reactive sputter methods that can in principle also be used for layer synthesis but which, for process-related reasons, do not have the possibility of adjusting the oxygen flow quasi independently of the process stability. The one skilled in the art knows that when working under oxygen gas, only small process windows are available in the sputter operation that avoid target poisoning. The operation of the arc sources in pure oxygen and with great oxygen flows resp. oxygen partial pressures also influences the conditioning process on the target surface. This is of great importance in mixed targets that are powder-metallurgical produced. After ignition of the arc, here is a clear modification of the target surface that suggests that the elementary components transform on the target surface into intermetallic compounds o mixed crystals. Depending on whether this process is desirable for the layer synthesis or not, when the target is used for the first time it is therefore run with or without target shutters in order to avoid a layer build-up onto the substrate or to achieve a reproduction of the conditioning (possible nucleation layer) during layer build-up.

The temperature stability of the oxide layer with the $NiAl_2O_4$ spinel structure was verified by subjecting these temperature cycles to temperatures up to 1100° C. and observing the stability of the x-ray spectra in these conditions. In this respect, there was no essential modification of the spectra suggesting a change in the crystal structure of the spinel. At temperatures above 1000° C., diffusion processes of the materials from the WC carbide cutting inserts merely occurred, for example the diffusion of the Co binder could be observed on the basis of RBS analyses.

Figure 9:
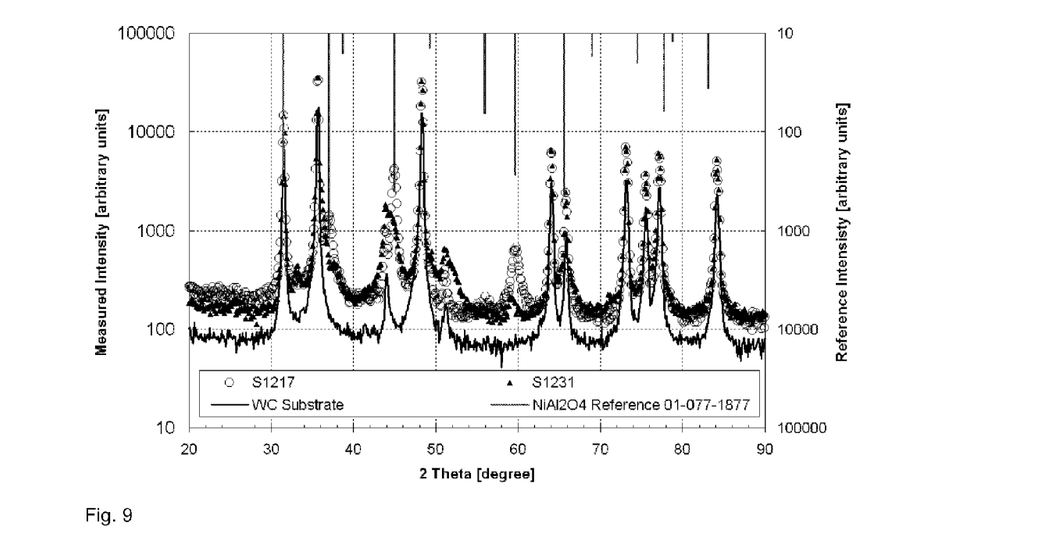
FIG. 9: a comparison of the XRD spectra of sample 1217 (NiAl$_2$O$_4$) with the synthetized Ni—Al—N layer (sample 1231), the reflexes of the oxide and of the nitride lie at about the same 2θ place.
Figure 10:
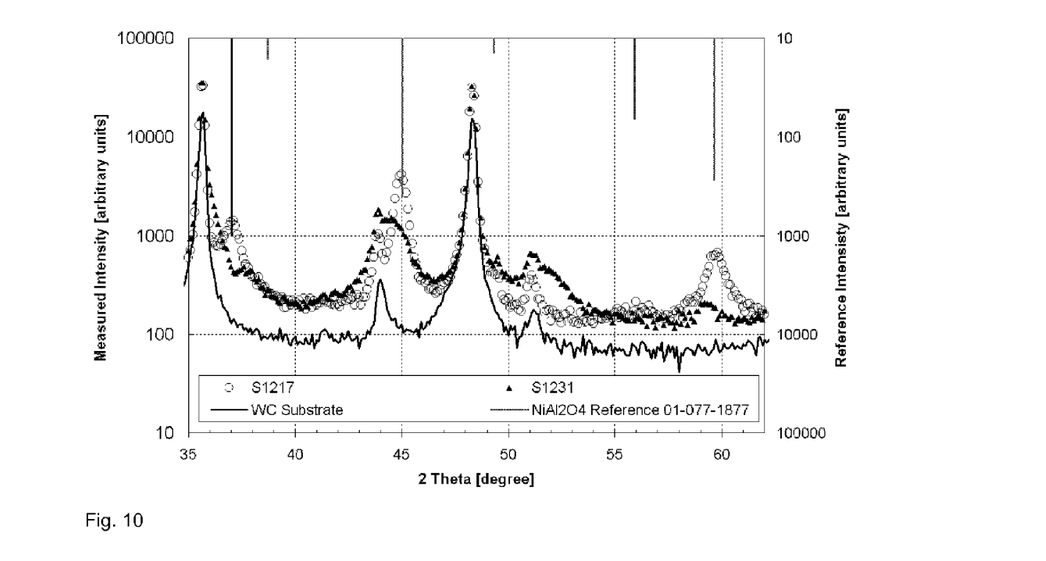
FIG. 10: a comparison of the XRD spectra of sample 1217 (NiAl$_2$O$_4$) with the synthetized Ni—Al—N layer (sample 1231), which shows in the 2θ scale with a better resolution the correlation of the oxide and nitride peaks.

The quality of the coupling of the Ni—Al oxide layer onto the substrate or onto the bonding or support layer is of primordial importance for the performance of the coated tool or component. From experience one can assume that material-related layer transitions create a very good bonding. It has however also been shown that materials with a similar crystal structure and lattice constant exhibit a more intimate bonding than materials that differ in terms of structure. In order then to bind the $NiAl_2O_4$ layer particularly well to the WC substrate, it was thus attempted to produce a Ni—Al—N layer while using the same targets that were used for the $NiAl_2O_4$ oxide functional layer. Thus, the Ni—Al targets were operated in nitrogen (either flow regulated or pressure regulated). An x-ray spectrum was established for the layer produced in this fashion. FIG. 9 shows the result of the XRD measurement of this layer as compared to the XRD measurement of sample 1217. Additionally, the x-ray spectrum of the WC substrates is again indicated and the bars again show the $NiAl_2O_4$ reference spectrum. For the Ni—Al—N layer, no reference spectrum could be found in the database, which indicates that this connection had not so far been synthetized or examined. The comparison yields that some peaks of the oxide and of the nitride are located in about the same positions, namely the (311), (400) and (511) peaks (oxide reference). This is represented again more clearly in FIG. 10 with expanded 2θ axis. The measurement result suggests similar crystal structures and allows the assumption that the nitrogen can be gradually replaced by the oxygen and vice-versa, without resulting in to great changes in the crystal structure, i.e. that Ni—Al—N is present in similar cubic structure as the NiAl$_2$O$_4$. This measurement result and the material similarity lead to the expectation of a good coupling behavior between nitride and oxide. In the experiments, no bonding problem between the Ni—Al—N and the Ni—Al—O layer could be observed and the scratch tests that were performed to quantify the bonding, also revealed above-average good bonding.

An excellent bonding of the Ni—Al-oxide to the previously deposited layer was however observed also with different materials if the other material exhibited a cubic structure. In particular, this could be observed for the coupling to Ti$_{0.5}$Al$_{0.5}$N, Ti$_{0.4}$Al$_{0.6}$N as well as Ti$_{0.34}$Al$_{0.66}$N and it is assumed that this also applies to large areas of other Ti/Al ratios, as long as the material exhibits a mainly cubic structure.

Figure 12:
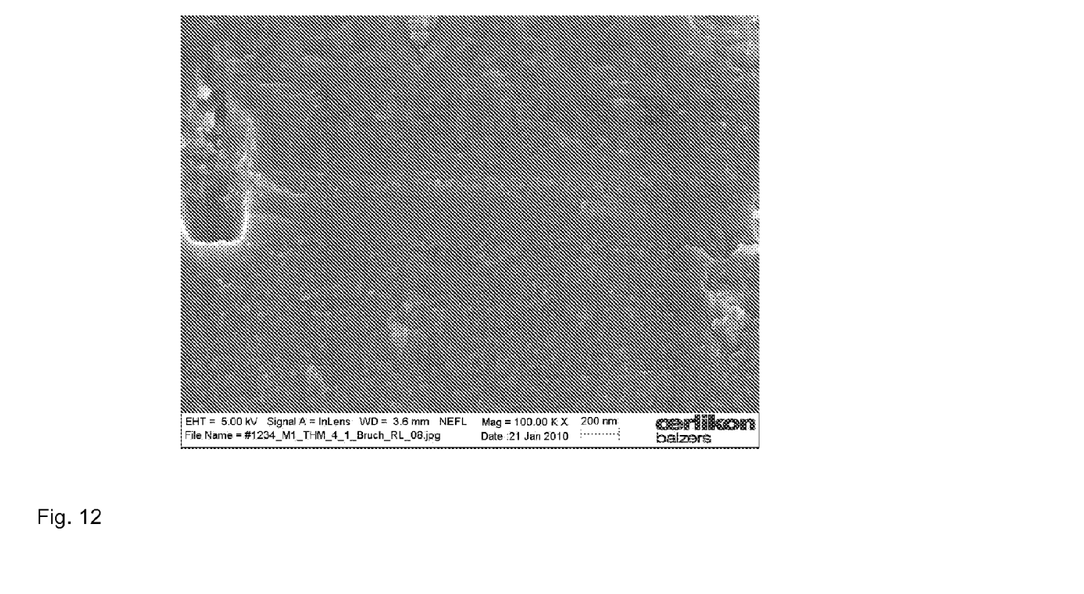
FIG. 12: an enlargement of an area of FIG. 11 between the layers.

By way of example, FIG. 11 represents an SEM cross-sectional view of a layer system consisting of an Al—Ti—N protection layer and an inventive Ni—Al—O functional layer. A greater enlargement of the area between the layers (FIG. 12) demonstrates the transition between nitride and oxide and shows that no abrupt modifications in the morphology of the layers will result, which indicates a good bonding. FIG. 11 also shows the typical droplets in the sub-micrometer range typical of arc evaporation and which occur especially when using multi-component targets. The cores of the droplets contain mainly the metal of the high-fusing component of the multi-component target. In the image, larger spatters an also be seen that were generated before the beginning of the oxide coating and that can be strongly reduced with skilled process control. Their number and size can be reduced (e.g. by using source shutters with target conditioning prior to coating with a closed source or covering of the "oxide" target during the nitride coating). These spatters however cannot be completely avoided in arc vaporization if the substrates are exposed directly to the sources and no elaborates filters are used.

Further examples of support layers with a cubic structure are TiN, CrN, TiCN and AlCrN, this enumeration being not considered limiting in any way. It is particularly advantageous to adapt to materials that are a multiple or a part of the lattice constants indicated in FIG. 13 for the NiAl$_2$O$_4$ of a =8.049. The one skilled in the art is aware that this lattice constant can be "finely adjusted" by varying the concentration of the elements constituting the layer resp. that it is possible to couple in a "mismatched" fashion (i.e. with small difference in the lattice constant of the superimposed layers). The stress thus incorporated into the layer system can be partly controlled through a multilayer system in such a way that it does not result in any layer peeling off.

It is thus advantageous for the performance of the layer that the process control enables an uncomplicated and safe production of layers in a multilayer structure. With reactive arc evaporation, multilayer structures can be produced in a very different way. The first method consists in operating targets of different materials alternatively or simultaneously staggered in space in the facility. Additionally, the reactive gas can further be varied, i.e. the oxygen or nitrogen flow or their pressures. Materials that form cubic structures both in the different materials as well as in the reaction products of the materials with the reactive gases are of particular advantage.

A further interesting method for multilayer production consists in using targets that consist of the same metallic components (here Ni—Al) but in this respect have a different composition. These too can of course be operated in an alternating or also simultaneous manner with different reactive gases. The result is then multilayer coatings in the same material system but with varying ratio of the target components (Ni/Al ratio) and corresponding reactive gas contents in the layer. Or also a multilayer design that in addition to the varying ratio of the target components is additionally generated and superimposed with different reactive gases.

What is novel is the production of the multilayer structures by using the same targets that are operated merely with a variation of the oxygen flow and for whose production in principle no substrate rotation is also required, although these can of course take place. As already discussed further above, the Ni/Al ratio also changes with the oxygen flow, which is the cause for the multilayer structure.

The layers produced according to the above method were tested as regards their mechanical properties. It is of course not possible to go into all the tests. By way of example, only the results of samples 1214 to 1217 are again indicated, for which the following was measured: Martens Hardness (HM) at maximum testing force, elastic indentation modulus (EIT/1-vs^2), plastic deformation component (nplast), indentation hardness (HIT) at maximum testing force and hardness value according to Vickers (HV). The results are reproduced in FIGS. 15 to 18. The layers exhibit outstanding Vickers hardness of about 3200 for the samples with low oxygen flow of 300 sccm and of approx. 3000 for the greater oxygen flow of 800 sccm. The elastic indentation modulus is higher by comparison to other PVD oxide layers and is even typical for some nitrides on an Al—Ti basis. By way of comparison, hardness measurements on a corundum standard sample was performed, which yielded a Vickers hardness between H$_v$=2500 to 2700. These hardness values thus lie below those of the inventive spinel layers.

Figure 19:
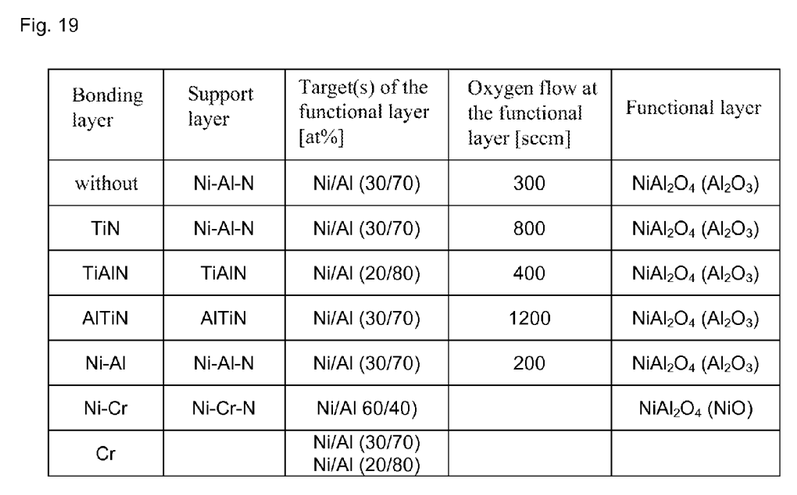
FIG. 19: examples of synthetized layer systems that contain NiAl$_2$O$_4$ material, as bonding layer Cr, CrN, AlCrN, Ni—Al—N, Ni—Cr—N, TiN, ZrN or VN can also be used, as support layer TiCN can for example also be used.

In order to demonstrate the possibilities with respect to layer materials, layer design and production methods, different layer systems were produced and they are represented in FIG. 19. The variation possibilities are great and FIG. 19 is not supposed to represent all possible layer systems. Nearly all bonding layers can be combined with nearly all support layer materials. However, it makes economic sense to arrange the entire layer system in such a way that the number of the targets of different materials should remain as small as possible, i.e. that all layers can be coated with one target material or at least the bonding and support layer with one material or the support and functional layer with one target material. The layer thicknesses were not indicated individually in FIG. 19 as they can be made to vary over a wide range. Typical thickness ranges for the different layers are:

bonding layer: 0.05 μm to 2 μm
support layer: 1 μm to 15 μm
functional layer: 1 μm to 15 μm It has furthermore also not been described in detail that the stress in the layer can be modified through the substrate bias and that, at a higher substrate bias, compressive stresses are generated that yield even greater values during the hardness measurement but that can lead to bonding problems at layer thicknesses over 10 μm.

The high hardness of the layers and the fact that these form the spinel structure with high temperature stability encouraged cutting tests in a material that is difficult to machine, such as in Austenitic stainless steels and alloys on the basis of nickel, titanium and titanium alloys. By way of example, the machining of a nickel-based alloy (Ni—Cr—Mo) will now be considered in more detail. The outer longitudinal rotation tests were performed on well ground cutting inserts with smooth surfaces and the comparison was between cutting inserts left uncoated, coated in standard fashion by the manufacturer (on Al—Ti—N basis) and coated with the inventive coating. By way of example, a support layer of $Ti_{0.34}Al_{0.66}N$ with the $NiAl_2O_4$ functional layer will be considered in more detail.

Coatings of 3 μm layer thickness (2 μm support layer, 1 μm functional layer) on the clearance surface were compared and the failure criterion for the lifespan comparison of the coated cutting inserts was selected at 300 nm of wear, in the event that failure of the tool did not occur previously. The cutting inserts were operated at cutting speeds of $v_c$=30, 60 and 90 m/min with a feed rate of 0.2 mm/Z and a cut depth of 2 mm. Cooling agents were used. The results shows the expected 25% improvement of the lifespan of the version coated by the manufacturer by comparison with the uncoated one for 30 m/min. At 60 m/min, the cutting edge of the uncoated tool became instable. The tool with the inventive layer showed a 50% longer lifespan compared with the uncoated tool at 30 m/min and, at 60 m/min, a 20% higher lifespan than the coated tool. At 90 m/min, a clear qualitative difference in terms of wear and tear was also recorded compared with the tool coated by the manufacturer, which suggests the cutting edge was stabilized by the inventive coating. In this range, the uncoated tool failed utterly.

The possibility of application of this hard coating stable at high temperatures was also tested for other applications outside tool coating. A favorable effect in this respect is that these oxide layers could also be produced at low temperatures, i.e. mild steels and also temperature-sensitive steels can be provided with these hard and oxidation-resistant coating. Components and parts in the field of motors were thus coated that are subjected to high wear at high temperatures, such as for example piston surfaces, piston rings and parts in the area of the turbo charger and other parts in the exhaust section. Protection in cases of hot gas corrosions for turbine applications in the aircraft industry is also advantageous.

A further application of this coating is expected for catalytic applications. It is known that Ni—Al—O ceramics, which can for example be produced with sol-gel technology, have catalytic properties, i.e. for example they render greenhouse gases harmless. This is why nickel is typically embedded in an aluminum oxide matrix, by applying nickel onto aluminum and heating it in contact with air. It is thus advantageous for a catalyzer to use the inventive $NiAl_2O_4$ coating with aluminum oxide, whose ratio can be adjusted. This is possible for the first time through a coating method that can produce both materials without high-temperature step and this within one process step.

Advantageous Effects of the Invention

As indicated, the invention enables layers to be produced (by means of reactive arc evaporation) which contain cubic $NiAl_2O_4$ in spinel structure (with splatters in the sub-micrometer range).

Additionally to the layer contents of cubic $NiAl_2O_4$ in spinel structure, the layer can have further portions of aluminum oxide consisting at least of one of the high-temperature modifications of the aluminum oxide and in fact of the aluminum oxide of the alpha, gamma, theta, kappa structure.

The layer can also be synthetized in such a way that it contains, in addition to cubic $NiAl_2O_4$ in spinel structure, portions of cubic Ni—O in different crystallite size. The layer can preferably also consist essentially only of cubic $NiAl_2O_4$ in spinel portion.

The coating is characterized by properties of high-temperature stability, i.e. that it has the high hardness typical for the spinel, which loses size less fast than is the case for nitrides. The cubic $NiAl_2O_4$ spinel structure of the inventive layer is preserved even at temperatures of above 1000° C.

The cubic $NiAl_2O_4$ layer ensures especially in combination with cubic under-layers stable layer transitions, especially with TiN, Ti—Al—N and TiCN, ZrN, ZrIAl—N, ZrCn, which contributes to outstanding layer bonding.

In addition to the inventive coating consisting of Ni—Al—O, yet a further new Ni—Al—N layer system was first synthetized with reactive arc coating and which has according to the measured XRD spectrum a cubic structure with the spinel with very similar lattice constants. This fact enables the Ni—Al—N and the Ni—Al—O layers to be bound to one another in a manner adapted both to the material as well as to the lattice constant.

The interlayer bonding between the Ni—Al—O layer with layers of different material is particularly advantageous, if the latter also has a cubic structure with lattice constants that are essentially an integer part or an integer multiple of the lattice constants of the Ni—Al—O spinel, such as for example Al—Ti—N.

The inventive coating of Ni—Al—O has a high hardness that is above Hv 2300, preferably above Hv 2500, even more preferably above Hv 2700. The mechanical strength of the Ni—Al—O spinel layer can be further improved by integrating aluminum oxides of the high temperature structures or by Ni—O, in particular in terms of toughness.

In this respect, the second oxide incorporated into the layer in addition to the $NiAl_2O_4$ preferably has a strongly different crystallite size, preferably smaller than that of the spinel and further preferably an x-ray amorphous structure.

A coating of $NiAl_2O_4$ and NiO has proved particularly stable chemically, with both oxides being present in a cubic structure.

As illustrated, the transition from nitride into the oxide can be achieved in the same target material.

It is the production of multilayer coatings from one target material by changing the oxygen flow or pressure, which surprisingly causes a change in the Ni/Al ratio in the multilayer structure.

The inventive method enables the production of a multilayer coating containing Ni-Al in continuous cubic structure by varying the nitrogen-oxygen flow.

The inventive method enables the production of $NiAl_2O_4$ coatings, in particular in spinel structure, wherein it is possible to control the ratio of aluminum oxide and nickel oxide through the oxygen flow.

Target

With the inventive method, from a plasma-deposited one-phased Ni—Al target, a target is obtained whose surface has several intermetallic compounds or mixed crystals of the following kind: $Al_3Ni$, $Al_3Ni_2$, AlNi, $Al_3Ni_5$, $AlNi_3$. The conditioning state of the target at the start is important in this respect. In particular, it is possible to condition the target behind a shutter by means of different oxygen flows. This is for example in order to avoid layer inhomogeneities.

The invention can advantageously be used among others for the following applications:

As wear-protection layer on cutting tools, especially of particular advantage on WC and cermets, ceramics, diamond and substrates containing Cr, such as for example HSS (high speed steel) and also for applications in material that is difficult to machine.

Between substrate and functional layer, a cubic CrN layer can be provided as support layer.

The inventive coatings can be used as high-temperature anti-corrosion protection in combustion engines and exhaust gas systems or for turbine blades.

As a final point, it should be noted that the inventive coatings are harder than corundum and, at least in the multilayer version, more elastic than common PVD oxides, that a lattice adjustment is possible and for example the embedding of a cubic $NiAl_2O_4$ structure in high-temperature aluminum oxide structures can be achieved.

A coating has been described that comprises at least one compound of oxygen and/or nitrogen with at least two metallic materials, characterized in that the compound is present at least partly in a spinel structure.

The coating can have an intrinsic compressive stress of the components having the compound between 0.2 GPa and 5 GPa. In this way, the stability of the coating is increased.

One of the at least two metallic materials is preferably nickel and/or aluminum. In the case of nickel and aluminum, the XRD spectrum exhibits possibly the 311, 400 reflexes and preferably also the 511 reflex.

The compound can be $NiAl_2O_4$ and other components of the coating can be present in x-ray amorphous phase. If necessary, the further components present in x-ray amorphous phase can include aluminum oxide and/or nickel oxide, wherein if necessary the aluminum oxide is preferably present in corundum structure and/or gamma phase.

Such a coating can include a plurality of superimposed layers and the layers can have essentially identical metallic chemical elements but with different metallic ratios. In particular, the layers can even have essentially identical chemical elements.

The coating can have the droplets typical for arc evaporation.

A cubic support layer can be included, preferably from the group Al—Ti—N, Ti—C—N, Ti—N, Cr—N or their mixtures.

A method for coating substrates by means of arc evaporation was disclosed that is characterized in that an alloy target is used as target that has between 10 at % and 80 at %, preferably between 20 at % and 60 at % nickel and that uses oxygen and/or nitrogen as reactive gas. The alloy target can comprise aluminum.

According to the invention, the Al/Ni ratio can be varied during the coating process by means of the oxygen flow, preferably between 300 sccm and 800 sccm.

Coated substrates, in particular tools or components, have been disclosed that are characterized in that the surface of the substrate onto which the coating comes to be applied comprises a steel, in particular a steel containing Cr, such as for example HSS (high speed steel). The coated substrate can be a cutting insert.

What is claimed is:

1. A coating including at least one layer which contains two components, wherein a first component comprises oxygen and/or nitrogen with at least two metallic elements and includes $NiAl_2O_4$ present at least partly in a spinel structure, and a second component comprises an x-ray amorphous phase, wherein the at least one layer exhibits droplets characteristic of a layer formed by spark evaporation.

2. The coating according to claim 1, characterized in that an intrinsic compressive stress of the components comprising the coating is between 0.2 GPa and 5 GPa.

3. The coating according to claim 1, characterized in that an x-ray diffraction spectrum exhibits at least two reflexes selected from the group consisting of 311, 400, and 511 reflexes.

4. The coating according to claim 1, characterized in that the second component present in x-ray amorphous phase includes at least one of aluminum oxide and nickel oxide.

5. The coating according to claim 4, wherein the aluminum oxide is present in at least one of corundum structure, theta phase, gamma phase, and kappa phase.

6. The coating according to claim 5, wherein the aluminum oxide comprises crystallites with sizes around 5 nm or smaller.

7. The coating according to claim 1, characterized in that the coating is formed from a plurality of superimposed layers, wherein the superimposed layers have identical metallic chemical elements but different metallic ratios.

8. The coating according to claim 7, characterized in that the superimposed layers have identical chemical elements.

9. A method for coating substrates by means of arc evaporation, characterized in that an alloy target containing aluminum as one component is used for production of a coating according to claim 8.

10. The method for coating substrates by means of arc evaporation according to claim 9, characterized in that an Al/Ni ratio can be varied by means of oxygen flow during the formation of the coating.

11. The method for coating substrates by means of arc evaporation according to claim 10, wherein the oxygen flow is between 300 sccm and 800 sccm.

12. The coating according to claim 1, characterized in that a cubic support layer is included.

13. The coating according to claim 12, wherein the cubic support layer is selected from group consisting of Al—Ti—N, Ti—C—N, Ti—N, Cr—N, and their mixtures.

14. A coated substrate, wherein in the coating is formed according to claim 13, and the coated substrate is a cutting insert.

15. The coating according to claim 1, wherein the droplets comprise a metallic material.

16. The coating according to claim 15, wherein a portion of the metallic material comprises less than 50 at. % nickel.

17. The coating according to claim 1, wherein the droplets comprise conglomerates of incompletely oxidized or incompletely nitrified metallic components or intermetallic components.

18. A coated substrate, wherein the coating is formed according to claim 1, and a surface of the substrate onto which the coating comes to be applied is a steel.

19. The coated substrate according to claim 18, characterized in that the steel contains Cr.

20. The coated substrate according to claim 18, characterized in that the steel is a high speed steel.

* * * * *